(12) United States Patent
Haba et al.

(10) Patent No.: US 8,941,999 B2
(45) Date of Patent: Jan. 27, 2015

(54) ENHANCED STACKED MICROELECTRONIC ASSEMBLIES WITH CENTRAL CONTACTS AND IMPROVED THERMAL CHARACTERISTICS

(71) Applicant: Tessera, Inc., San Jose, CA (US)

(72) Inventors: Belgacem Haba, Saratoga, CA (US);
Wael Zohni, San Jose, CA (US);
Richard Dewitt Crisp, Hornitos (AD)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/046,233

(22) Filed: Oct. 4, 2013

(65) Prior Publication Data

US 2014/0035121 A1  Feb. 6, 2014

Related U.S. Application Data

(63) Continuation of application No. 12/907,522, filed on Oct. 19, 2010, now Pat. No. 8,553,420.

(51) Int. Cl.
*H05K 7/00* (2006.01)
*H05K 1/11* (2006.01)
(Continued)

(52) U.S. Cl.
CPC ............ *H01L 25/0657* (2013.01); *H01L 23/13* (2013.01); *H01L 23/3677* (2013.01); *H01L 23/4334* (2013.01); *H01L 23/49816* (2013.01); *H01L 24/33* (2013.01); *H01L 24/48* (2013.01); *H01L 24/49* (2013.01); *H01L 24/73* (2013.01); *H01L 25/105* (2013.01);
(Continued)

(58) Field of Classification Search
USPC .......................................... 257/698, 778, 779
See application file for complete search history.

(56) References Cited

U.S. PATENT DOCUMENTS

| 4,941,033 | A | 7/1990 | Kishida |
| 5,148,265 | A | 9/1992 | Khandros et al. |

(Continued)

FOREIGN PATENT DOCUMENTS

| CN | 101055840 A | 10/2007 |
| JP | 62107391 | 5/1987 |

(Continued)

OTHER PUBLICATIONS

International Search Report for Application No. PCT/US2011/056352 dated Apr. 5, 2012.

(Continued)

*Primary Examiner* — Hoa C Nguyen
*Assistant Examiner* — Xanthia C Cunningham
(74) *Attorney, Agent, or Firm* — Lerner, David, Littenberg, Krumholz & Mentlik, LLP

(57) ABSTRACT

A microelectronic assembly includes a dielectric element that has oppositely-facing first and second surfaces and first and second apertures extending between the surfaces. The dielectric element further includes conductive elements. First and second microelectronic elements are stacked one on top of the another. The second microelectronic element has a plurality of contacts at a surface, which is spaced from the first surface of the dielectric element. Leads extend from contacts of the first and second microelectronic elements through respective apertures to at least some of the conductive elements. A heat spreader is thermally coupled to at least one of the first microelectronic element or the second microelectronic element.

13 Claims, 5 Drawing Sheets

(51) Int. Cl.
- *H05K 1/14* (2006.01)
- *H01L 25/065* (2006.01)
- *H01L 23/13* (2006.01)
- *H01L 23/367* (2006.01)
- *H01L 23/433* (2006.01)
- *H01L 23/498* (2006.01)
- *H01L 23/00* (2006.01)
- *H01L 25/10* (2006.01)
- *H01L 23/31* (2006.01)

(52) U.S. Cl.
CPC .. *H01L 23/3128* (2013.01); *H01L 2224/32145* (2013.01); *H01L 2224/32188* (2013.01); *H01L 2224/48091* (2013.01); *H01L 2224/4824* (2013.01); *H01L 2224/484* (2013.01); *H01L 2224/49111* (2013.01); *H01L 2224/731* (2013.01); *H01L 2224/73215* (2013.01); *H01L 2224/73253* (2013.01); *H01L 2225/0651* (2013.01); *H01L 2225/06562* (2013.01); *H01L 2225/06575* (2013.01); *H01L 2225/06589* (2013.01); *H01L 2924/01014* (2013.01); *H01L 2924/01029* (2013.01); *H01L 2924/01049* (2013.01); *H01L 2924/0105* (2013.01); *H01L 2924/01082* (2013.01); *H01L 2924/014* (2013.01); *H01L 2924/10253* (2013.01); *H01L 2924/15311* (2013.01); *H01L 2924/15331* (2013.01); *H01L 2924/30107* (2013.01); *H01L 2924/01033* (2013.01); *H01L 2924/01087* (2013.01); *H01L 2224/32225* (2013.01); *H01L 2225/1023* (2013.01); *H01L 2225/1058* (2013.01); *H01L 2225/1094* (2013.01); *H01L 24/32* (2013.01); *H01L 2224/06136* (2013.01)
USPC .......................................... 361/735; 361/803

(56) References Cited

U.S. PATENT DOCUMENTS

| | | |
|---|---|---|
| 5,148,266 A | 9/1992 | Khandros et al. |
| 5,347,159 A | 9/1994 | Khandros et al. |
| 5,480,840 A | 1/1996 | Barnes et al. |
| 5,679,977 A | 10/1997 | Khandros et al. |
| 5,861,666 A | 1/1999 | Bellaar |
| 5,977,640 A | 11/1999 | Bertin et al. |
| 5,998,864 A | 12/1999 | Khandros et al. |
| 6,021,048 A | 2/2000 | Smith |
| 6,150,724 A | 11/2000 | Wenzel et al. |
| 6,199,743 B1 | 3/2001 | Bettinger et al. |
| 6,218,728 B1 | 4/2001 | Kimura |
| 6,218,731 B1 | 4/2001 | Huang et al. |
| 6,353,539 B1 | 3/2002 | Horine et al. |
| 6,369,448 B1 | 4/2002 | McCormick |
| 6,385,049 B1 | 5/2002 | Chia-Yu et al. |
| 6,392,292 B1 | 5/2002 | Morishita |
| 6,414,396 B1 | 7/2002 | Shim et al. |
| 6,445,594 B1 | 9/2002 | Nakagawa et al. |
| 6,472,741 B1 | 10/2002 | Chen et al. |
| 6,492,726 B1 | 12/2002 | Quek et al. |
| 6,583,502 B2 | 6/2003 | Lee et al. |
| 6,703,713 B1 | 3/2004 | Tseng et al. |
| 6,720,666 B2 | 4/2004 | Lim et al. |
| 6,731,009 B1 | 5/2004 | Jones et al. |
| 6,734,542 B2 | 5/2004 | Nakatani et al. |
| 6,742,098 B1 | 5/2004 | Halbert et al. |
| 6,762,942 B1 | 7/2004 | Smith |
| 6,793,116 B2 | 9/2004 | Harada |
| 6,811,580 B1 | 11/2004 | Littecke |
| 6,818,474 B2 | 11/2004 | Kim et al. |
| 6,977,440 B2 | 12/2005 | Pflughaupt et al. |
| 7,061,105 B2 | 6/2006 | Masuda et al. |
| 7,061,121 B2 | 6/2006 | Haba |
| 7,095,104 B2 | 8/2006 | Blackshear |
| 7,205,656 B2 | 4/2007 | Kim et al. |
| 7,389,937 B2 | 6/2008 | Ito |
| 7,462,936 B2 | 12/2008 | Haba et al. |
| 7,504,284 B2 | 3/2009 | Ye et al. |
| 7,633,146 B2 | 12/2009 | Masuda et al. |
| 7,638,868 B2 | 12/2009 | Haba |
| 7,855,462 B2 | 12/2010 | Boon et al. |
| 7,880,310 B2 | 2/2011 | Mathew |
| 7,892,889 B2 | 2/2011 | Howard et al. |
| 7,969,006 B2 | 6/2011 | Lin et al. |
| 8,026,589 B1 | 9/2011 | Kim et al. |
| 8,254,155 B1 | 8/2012 | Crisp et al. |
| 8,304,881 B1 | 11/2012 | Haba et al. |
| 8,378,478 B2 | 2/2013 | Desai et al. |
| 2001/0005311 A1 | 6/2001 | Duesman et al. |
| 2002/0030267 A1* | 3/2002 | Suzuki ........................ 257/698 |
| 2002/0053727 A1 | 5/2002 | Kimura |
| 2002/0175421 A1 | 11/2002 | Kimura |
| 2003/0064547 A1 | 4/2003 | Akram et al. |
| 2003/0179549 A1* | 9/2003 | Zhong et al. ................ 361/707 |
| 2003/0183917 A1 | 10/2003 | Tsai et al. |
| 2003/0193788 A1 | 10/2003 | Farnworth et al. |
| 2004/0016999 A1 | 1/2004 | Misumi |
| 2004/0124520 A1 | 7/2004 | Rinne |
| 2004/0184240 A1 | 9/2004 | Su |
| 2004/0262774 A1 | 12/2004 | Kang et al. |
| 2005/0110125 A1 | 5/2005 | Blackshear |
| 2005/0110162 A1 | 5/2005 | Meyer-Berg et al. |
| 2005/0116326 A1 | 6/2005 | Haba et al. |
| 2005/0116358 A1 | 6/2005 | Haba |
| 2005/0133932 A1 | 6/2005 | Pohl et al. |
| 2005/0164486 A1 | 7/2005 | Lua et al. |
| 2005/0173807 A1 | 8/2005 | Zhu et al. |
| 2005/0218514 A1 | 10/2005 | Massingill |
| 2005/0258538 A1 | 11/2005 | Gerber |
| 2006/0006405 A1 | 1/2006 | Mazzochette |
| 2006/0027902 A1 | 2/2006 | Ararao et al. |
| 2006/0081583 A1 | 4/2006 | Hembree et al. |
| 2006/0097379 A1* | 5/2006 | Wang ........................ 257/701 |
| 2006/0097400 A1 | 5/2006 | Cruz et al. |
| 2006/0113653 A1 | 6/2006 | Xiaoqi et al. |
| 2006/0145323 A1 | 7/2006 | Lee |
| 2006/0231938 A1 | 10/2006 | Mangrum |
| 2006/0249827 A1 | 11/2006 | Fasano et al. |
| 2006/0290005 A1 | 12/2006 | Thomas et al. |
| 2007/0075409 A1 | 4/2007 | Letterman et al. |
| 2007/0108592 A1 | 5/2007 | Lai et al. |
| 2007/0120238 A1 | 5/2007 | Vaiyapuri |
| 2007/0152310 A1 | 7/2007 | Osborn et al. |
| 2007/0160817 A1 | 7/2007 | Roh |
| 2007/0164407 A1 | 7/2007 | Jun et al. |
| 2007/0176297 A1 | 8/2007 | Zohni |
| 2007/0176298 A1 | 8/2007 | Osone et al. |
| 2007/0181989 A1 | 8/2007 | Corisis et al. |
| 2007/0218689 A1 | 9/2007 | Ha et al. |
| 2007/0235886 A1 | 10/2007 | Yilmaz et al. |
| 2007/0257376 A1 | 11/2007 | Shimokawa et al. |
| 2008/0001241 A1 | 1/2008 | Tuckerman et al. |
| 2008/0001309 A1 | 1/2008 | Tago |
| 2008/0023805 A1 | 1/2008 | Howard et al. |
| 2008/0036067 A1 | 2/2008 | Lin |
| 2008/0048777 A1 | 2/2008 | Kohjiro et al. |
| 2008/0073777 A1 | 3/2008 | Cui et al. |
| 2008/0093725 A1 | 4/2008 | Jung et al. |
| 2008/0122067 A1 | 5/2008 | Wang |
| 2008/0136006 A1 | 6/2008 | Jang et al. |
| 2008/0246130 A1 | 10/2008 | Carney et al. |
| 2008/0296717 A1 | 12/2008 | Beroz et al. |
| 2008/0303153 A1 | 12/2008 | Oi et al. |
| 2008/0315377 A1 | 12/2008 | Eichelberger et al. |
| 2009/0017583 A1 | 1/2009 | Jun et al. |
| 2009/0045524 A1 | 2/2009 | Mohammed et al. |
| 2009/0051043 A1 | 2/2009 | Wong et al. |
| 2009/0057864 A1 | 3/2009 | Choi et al. |
| 2009/0068858 A1 | 3/2009 | Di Stefano |
| 2009/0079061 A1 | 3/2009 | Mallik et al. |
| 2009/0104734 A1 | 4/2009 | Specht et al. |
| 2009/0108422 A1 | 4/2009 | Sasaki et al. |
| 2009/0168366 A1 | 7/2009 | Clayton et al. |

(56) References Cited

U.S. PATENT DOCUMENTS

| | | |
|---|---|---|
| 2009/0179321 A1 | 7/2009 | Sakamoto et al. |
| 2009/0185317 A1 | 7/2009 | Dijkhuis et al. |
| 2009/0200652 A1 | 8/2009 | Oh et al. |
| 2009/0200680 A1 | 8/2009 | Shinohara et al. |
| 2009/0236700 A1 | 9/2009 | Moriya |
| 2009/0243064 A1 | 10/2009 | Camacho et al. |
| 2009/0256266 A1 | 10/2009 | Lao et al. |
| 2009/0267222 A1 | 10/2009 | Zhong et al. |
| 2010/0065955 A1 | 3/2010 | Chye et al. |
| 2010/0072602 A1 | 3/2010 | Sutardja |
| 2010/0090326 A1 | 4/2010 | Baek et al. |
| 2010/0127362 A1 | 5/2010 | Fan et al. |
| 2010/0133665 A1 | 6/2010 | Ha et al. |
| 2010/0193930 A1 | 8/2010 | Lee |
| 2010/0244278 A1 | 9/2010 | Shen |
| 2010/0258928 A1 | 10/2010 | Chi et al. |
| 2010/0295166 A1 | 11/2010 | Kim |
| 2010/0314740 A1 | 12/2010 | Choi et al. |
| 2010/0321885 A1 | 12/2010 | Huang |
| 2010/0327419 A1 | 12/2010 | Muthukumar et al. |
| 2011/0079905 A1 | 4/2011 | Sanchez et al. |
| 2011/0085304 A1 | 4/2011 | Bindrup et al. |
| 2012/0091574 A1 | 4/2012 | Lin et al. |
| 2012/0092832 A1 | 4/2012 | Haba et al. |
| 2012/0153435 A1 | 6/2012 | Haba et al. |
| 2012/0267796 A1 | 10/2012 | Haba et al. |
| 2012/0267798 A1 | 10/2012 | Haba et al. |
| 2013/0082394 A1 | 4/2013 | Crisp et al. |
| 2013/0099387 A1 | 4/2013 | Caskey et al. |
| 2013/0168843 A1 | 7/2013 | Zohni |

FOREIGN PATENT DOCUMENTS

| | | | |
|---|---|---|---|
| JP | 2001196407 | A | 7/2001 |
| JP | 2002-076252 | A | 3/2002 |
| JP | 2004-063767 | A | 2/2004 |
| JP | 2005251957 | A | 9/2005 |
| JP | 2006079629 | A | 3/2006 |
| JP | 2008-198841 | A | 8/2008 |
| JP | 2010-098098 | A | 4/2010 |
| KR | 2001-0002214 | A | 1/2001 |
| KR | 20010081922 | A | 8/2001 |
| KR | 2001-0094894 | A | 11/2001 |
| KR | 10-0382035 | B1 | 4/2003 |
| KR | 10-0393095 | B1 | 7/2003 |
| KR | 2005-0119414 | A | 12/2005 |
| KR | 2006-0120365 | A | 11/2006 |
| KR | 10-0690247 | B1 | 2/2007 |
| KR | 1020060004298 | | 3/2007 |
| KR | 2007-0088177 | A | 8/2007 |
| KR | 2009-0008341 | A | 1/2009 |
| KR | 2009-0086314 | A | 8/2009 |
| KR | 2010-0041430 | A | 4/2010 |
| KR | 101011863 | B1 | 1/2011 |
| KR | 101061531 | B1 | 9/2011 |
| WO | 2007088757 | A1 | 8/2007 |

OTHER PUBLICATIONS

Asinash Roy et al: "Effects of Coupling Capacitance and Inductance on Delay Uncertainty and Clock Skew", 2007 44th ACM/IEEE Design Automation Conference, San Diego, CA, Jun. 4-8, 2007, IEEE, PI Scataway, NJ, Jun. 1, 2007, pp. 184-187, XP031183328.
International Search Report and Written Opinion for application No. PCT/US2012/029873 dated Jun. 4, 2012.
International Search Report and Written Opinion for Application No. PCT/US2012/029876 dated Aug. 17, 2012.
International Search Report and Written Opinion for Application No. PCT/US2012/032997 dated Aug. 7, 2012.
International Search Report and Written Opinion for Application No. PCT/US2013/053240 dated Sep. 16, 2013.
International Search Report and Written Opinion for Application No. PCT/US2013/065605 dated Feb. 21, 2014.
International Search Report and Written Opinion for PCT/US2012/034196 dated Jun. 4, 2012.
International Search Report Application No. PCT/US2011/031391, dated Dec. 12, 2011.
Korean Application No. 10-2011-0041843, dated May, 3, 2011 (English translation of Spec and drawings).
Korean Search Report from U.S. Appl. No. 61/477,820, dated Sep. 6, 2011.
Korean Search Report from U.S. Appl. No. 61/477,877, dated Sep. 6, 2011.
Korean Search Report from U.S. Appl. No. 61/477,883, dated Sep. 6, 2011.
Korean Search Report from U.S. Appl. No. 61/477,967, dated Sep. 6, 2011.
Office Action from Korean Patent Application No. 10-2010-0129888 dated Jan. 18, 2011.
Office Action from Korean Patent Application No. 10-2010-0129890 dated Jan. 18, 2011.
Partial International Search Report Application No. PCT/US2011/031391, dated Aug. 25, 2011.
Partial International Search Report for Application No. PCT/US2012/032997 dated Jun. 27, 2012.
Partial Search Report for Application No. PCT/US2013/065605 dated Nov. 28, 2013.
Search Report from Korean Patent Application No. 10-2010-0129888 dated Jan. 18, 2011.
Search Report from Korean Patent Application No. 10-2010-0129890 dated Jan. 18, 2011.
Taiwanese Office Action for Application No. 101112514 dated Mar. 13, 2014.
Written Opinion of the International Preliminary Examining Authority dated Apr. 16, 2013 for Application No. PCT/US2012/029876.
Inernational Search Report and Written Opinion for Application No. PCT/US2012/071630 dated Apr. 4, 2013.
U.S. Appl. No. 61/477,877, filed Apr. 21, 2011.

* cited by examiner

ENHANCED STACKED MICROELECTRONIC ASSEMBLIES WITH CENTRAL CONTACTS AND IMPROVED THERMAL CHARACTERISTICS

CROSS-REFERENCE TO RELATED APPLICATIONS

The present application is a continuation of U.S. patent application Ser. No. 12/907,522, filed Oct. 19, 2010, which will issue as U.S. Pat. No. 8,553,420 on Oct. 8, 2013, the disclosure of which is incorporated herein by reference.

BACKGROUND OF THE INVENTION

The present invention relates to stacked microelectronic assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of a package substrate, i.e., chip carrier and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Besides minimizing the planar area of the circuit panel occupied by microelectronic assembly, it is also desirable to produce a chip package that presents a low, overall height or dimension perpendicular to the plane of the circuit panel. Such thin microelectronic packages allow for placement of a circuit panel having the packages mounted therein in close proximity to neighboring structures, thus producing the overall size of the product incorporating the circuit panel. Various proposals have been advanced for providing plural chips in a single package or module. In the conventional "multi-chip module", the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module.

It has also been proposed to package plural chips in a "stack" arrangement i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977; 5,148, 265; and 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite these efforts in the art, further improvements would be desirable in the case of multi-chip packages for chips having contacts located substantially in central regions of the chips. Certain semiconductor chips, such as some memory chips, are commonly made with the contacts in one or two rows located substantially along a central axis of the chip.

BRIEF SUMMARY OF THE INVENTION

A microelectronic assembly includes a dielectric element having oppositely-facing first and second surfaces and one or more apertures extending between the surfaces, the dielectric element further having conductive elements thereon; a first microelectronic element having a rear surface and a front surface facing the first surface of the dielectric element, the first microelectronic element having a first edge and a plurality of contacts exposed at the front surface thereof; a second microelectronic element including having a rear surface and a front surface facing the rear surface of the first microelectronic element, a projecting portion of the front surface of the second microelectronic element extending beyond the first edge of the first microelectronic element, the projecting portion being spaced from the first surface of the dielectric element, the second microelectronic element having a plurality of contacts exposed at the projecting portion of the front surface; leads extending from contacts of the microelectronic elements through the at least one aperture to at least some of the conductive elements; and a heat spreader thermally coupled to at least one of the first microelectronic element or the second microelectronic element.

DETAILED DESCRIPTION

Figure 1:
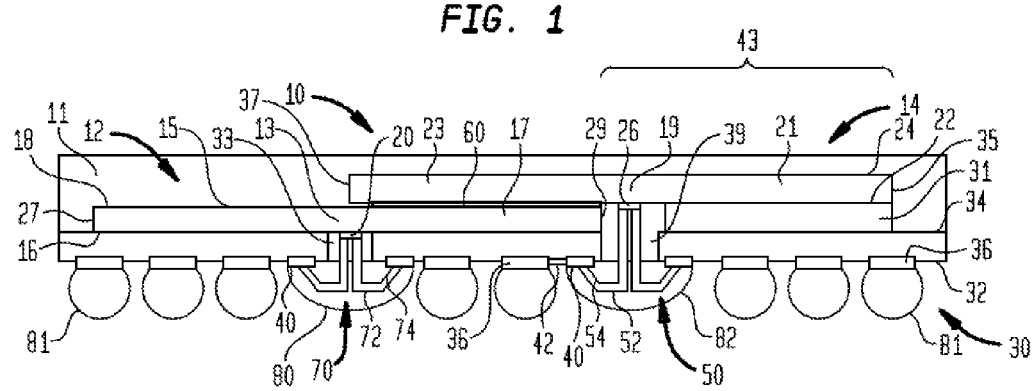
FIG. 1 is a diagrammatic sectional elevation view of a stacked microelectronic assembly according to an embodiment of the present invention.

With reference to FIG. 1, a stacked microelectronic assembly 10 according to an embodiment of the present invention includes a first microelectronic element 12 and a second microelectronic element 14. In some embodiments, the first and second microelectronic elements 12 and 14 may be a semiconductor chip, a wafer, or the like.

The first microelectronic element 12 has a front surface 16, a rear surface 18 remote therefrom, and first and second edges 27, 29, extending between the front and rear surfaces. The front surface 16 of the first microelectronic element 12 includes first and second end regions 15 and 17 and a central region 13 located between the first and second end regions 15 and 17. The first end region 15 extends between the central region 13 and first edge 27, and the second end region 17 extends between the central region 13 and the second edge 29. Electrical contacts 20 are exposed at the front surface 16 of the first microelectronic element 12. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure. The contacts 20 of the first microelectronic element 12 are exposed at the front surface 16 within the central region 13. For example, contacts 20 may be arranged in one or two parallel rows adjacent the center of first surface 16.

The second microelectronic element 14 has a front surface 22, a rear surface 24 remote therefrom, and first and second edges 35, 37, extending between the front and rear surfaces. The front surface 22 of the second microelectronic element 14 includes first and second end regions 21 and 23 and a central region 19 located between the first and second end regions 21 and 23. The first end region 21 extends between the central region 19 and first edge 35, and the second end region 23 extends between the central region 19 and the second edge 37. Electrical contacts 26 are exposed at the front surface 22 of the second microelectronic element 14. The contacts 26 of the second microelectronic element 14 are exposed at the front surface 22 within the central region 19. For example, contacts 26 may be arranged in one or two parallel rows adjacent the center of first surface 22.

As seen in FIG. 1, the first and second microelectronic elements 12 and 14 are stacked relative to each other. In some embodiments, the front surface 22 of the second microelectronic element 14 and the rear surface 18 of the first microelectronic element 12 face each other. At least a portion of the second end region 23 of the second microelectronic element 14 overlies at least a portion of the second end region 17 of the first microelectronic element 12. At least a portion of the central region 19 of the second microelectronic element 14 projects beyond the second edge 29 of the first microelectronic element 12. Furthermore, a portion 43 of the second microelectronic element 14 extends beyond second edge 29 of the first microelectronic element 12. Accordingly, the contacts 26 of the second microelectronic element 14 are positioned in a location beyond the second edge 29 of the first microelectronic element 12.

The microelectronic assembly 10 further includes a dielectric element 30 having oppositely-facing first and second surfaces 32 and 34. While FIG. 1 shows only one dielectric element 30, the microelectronic assembly 10 may include more than one dielectric element. One or more electrically conductive elements or terminals 36 are exposed at the first surface 32 of the dielectric element 30. At least some terminals 36 may be movable with respect to the first and/or second microelectronic element 12 and 14.

The dielectric element 30 may further include one or more apertures. In the embodiment depicted in FIG. 1, the dielectric element 30 includes a first aperture 33 substantially aligned with the central region 13 of the first microelectronic element 12 and a second aperture 39 substantially aligned with the central region 19 of the second microelectronic element 14, thereby providing access to contacts 20 and 26.

As seen in FIG. 1, the dielectric element 30 may extend beyond the first edge 27 of the first microelectronic element 12 and the second edge 35 of the second microelectronic element 14. The second surface 34 of the dielectric element 30 may be juxtaposed with the front surface 16 of the first microelectronic element 12. The dielectric element 30 may be partly or entirely made of any suitable dielectric material. For example, the dielectric element 30 may comprise a layer of flexible material, such as a layer of polyimide, BT resin or other dielectric material of the commonly used for making tape automated bonding ("TAB") tapes. Alternatively, the dielectric element 30 may comprise a relatively rigid, board like material such as a thick layer of fiber-reinforced epoxy, such as, Fr-4 or Fr-5 board. Regardless of the material employed, the dielectric element 30 may include a single layer or multiple layers of dielectric material.

The dielectric element 30 may also include electrically conductive elements 40 exposed on the first surface 32 and electrically conductive traces 42. The electrically conductive traces 42 electrically couple the electrically conductive elements 40 to the terminals 36.

A spacing or support element 31, such as an adhesive layer, may be positioned between the first end region 21 of the second microelectronic element 14 and a portion of the dielectric element 30. If spacing layer 31 includes an adhesive, the adhesive can connect the second microelectronic element 14 to the dielectric element 30. Another spacing layer 60 may be positioned between the second end region 23 of the second microelectronic element 14 and the second end region 17 of the first microelectronic element 12. This spacing layer 60 may include adhesive for bonding the first and second microelectronic elements 12 and 14 together. In such case, the spacing layer 60 may be partly or entirely made of a die-attach adhesive and may be comprised of a low elastic modulus material such as silicone elastomer. However, the spacing layer 60 may be entirely or partly made of a thin layer of high elastic modulus adhesive or solder if the two microelectronic elements 12 and 14 are conventional semiconductors chips formed of the same material, because the microelectronic elements will tend to expand and contract in unison in response to temperature changes. Irrespective of the materials employed, each of spacing layers 31 and 60 may include a single layer or multiple layers.

Figure 2:
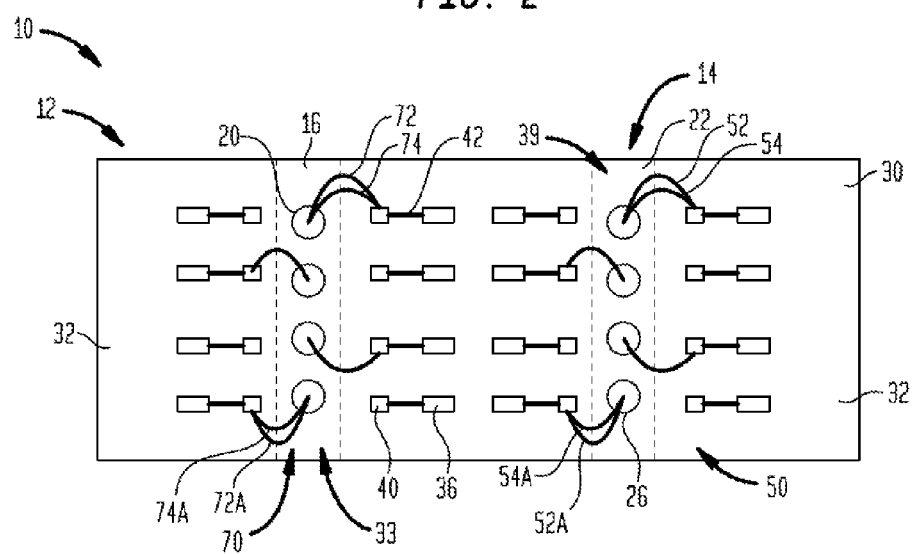
FIG. 2 is a bottom view of the stacked assembly of FIG. 1.

As seen in FIGS. 1 and 2, electrical connections or leads 70 electrically connect contacts 20 of the first microelectronic element 12 to some electrically conductive elements 40 on the dielectric element 30. Electrical connections 70 may include multiple wire bonds 72, 74 electrically connecting a contact of microelectronic element 12 with a conductive element 40. Wire bonds 72, 74 extend through the first aperture 33 and are oriented substantially parallel to each other. Each of the wire bonds 72 and 74 electrically couples a contact 20 to a corresponding conductive element 40 of the dielectric element. A multiple wire bond structure according to this embodiment can substantially decrease inductance of a wire bond connection by providing an additional path for current to flow between the connected contacts.

Other electrical connections or leads 50 electrically couple contacts 26 of the second microelectronic element 14 to some conductive elements 40. Electrical connections 50 may include multiple wire bonds 52, 54 electrically connecting a contact of microelectronic element 14 with a conductive element 40. Wire bonds 52, 54 extend through the second aperture 39 and are oriented substantially parallel to each other. Both wire bonds 52 and 54 electrically couple a contact 26 to a corresponding element 40 of the dielectric element 30. A multiple bond wire structure according to this embodiment can substantially decrease inductance of a wire bond connection by providing an additional path for current to flow between the connected contacts.

The microelectronic assembly 10 further includes an overmold 11 covering at least the first microelectronic element 12 and the second microelectronic element 14. As seen in FIG. 1, the overmold 11 may also cover portions of the dielectric element 30 extending beyond the first edge 27 of the first microelectronic element 12 and the first edge 35 of the second microelectronic element 14.

Figure 3:
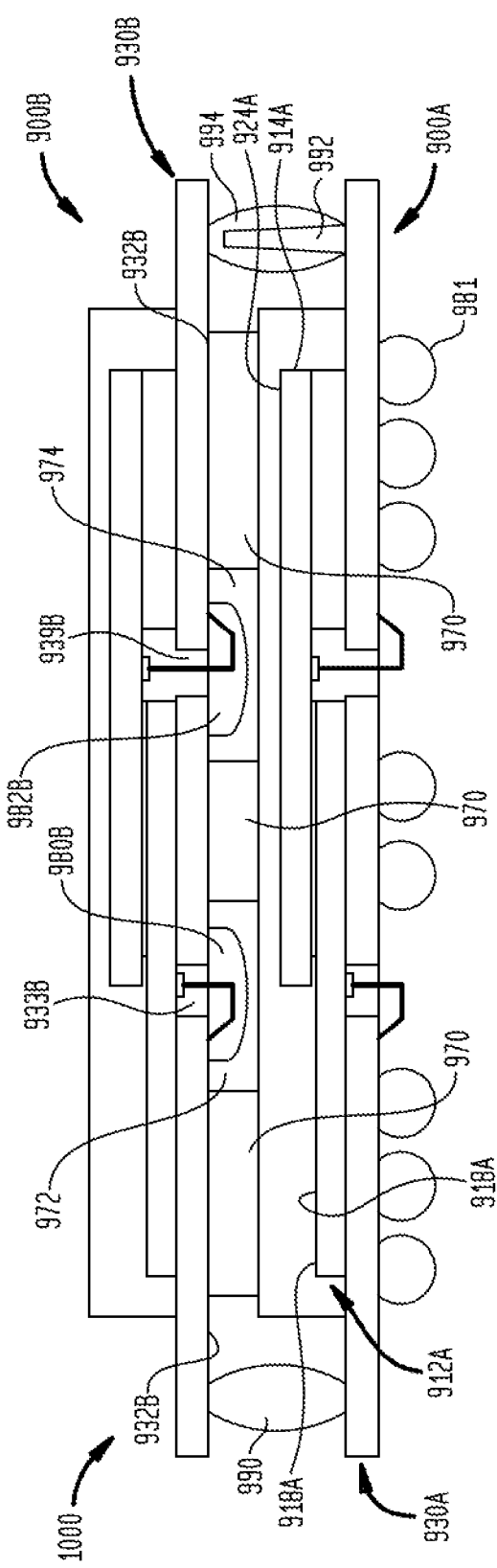
FIG. 3 is a diagrammatic sectional view of a stacked microelectronic arrangement according to another embodiment of the present invention.

FIG. 3 depicts an arrangement 1000 including at least two stacked and electrically interconnected microelectronic assemblies 900. Microelectronic assemblies 900A and 900B may be any of the assemblies described above. At least one of the microelectronic assemblies may have conductive joining units attached to terminals thereof, such as solder balls 981 or other masses of bond and metal, e.g., tin, indium, or a combination thereof. The two microelectronic assemblies 900 are electrically connected to each other through any suitable electrically conductive connections. For example, the assemblies can be electrically interconnected via solder columns 990 which are joined to pads (not shown) on the dielectric elements 930A, 930B of the respective microelectronic elements. In a particular embodiment also shown in FIG. 3, electrically conductive posts 992 and solder 994 can be used to electrically interconnect the two microelectronic assemblies 900A and 900B. Posts 992 may extend either from the first assembly or from the second assembly towards the other, or posts provided on both assemblies may extend towards each other.

With continued reference to FIG. 3, a heat spreader 970 can be disposed between the first and second microelectronic assemblies 900A and 900B to help distribute heat evenly within the arrangement of stacked microelectronic assemblies. The heat spreader 970 may also improve heat dissipation to the surrounding environment. The heat spreader may be partly or entirely made of any suitable thermally conductive material. Examples of suitable thermally conductive material include, but are not limited to, metal, graphite, thermally-conductive adhesives, e.g., thermally-conductive epoxy, a solder, or the like, or a combination of such materials. In one example, the heat spreader can be a substantially continuous sheet of metal. In a particular embodiment, a pre-formed heat spreader 970 made of metal or other thermally conductive material may be attached to or disposed on the front surface 932B of the dielectric element 930B of the second microelectronic assembly 900B such as with a thermally conductive material such as a thermally conductive adhesive or thermally conductive grease. The adhesive if present, can be a compliant material which permits relative movement between the heat spreader and the microelectronic element or dielectric element to which it is attached, such as to accommodate differential thermal expansion between the compliantly attached elements. The heat spreader 970 may be a monolithic structure and may include one or more apertures 972, 974 substantially aligned with the apertures 933B, 939B of the dielectric element 930B, respectively. In one embodiment, each of the apertures 972, 974 of the heat spreader 970 may be dimensioned to receive the encapsulant 980B or 982B covering the aperture 933B or 939B of the dielectric element 930B. Alternatively, the heat spreader 970 may include multiple spreader portions spaced apart from one another. Although not shown, the heat spreader 970 may alternatively be attached to the rear surface 924A of the second microelectronic element 914A of microelectronic assembly 900A or to the rear surface 918A of the first microelectronic element 912A of the first microelectronic assembly 900A, or to the rear surfaces of both microelectronic elements 912A, 914A. In a particular embodiment, the heat spreader may be or include a layer of solder joined directly to at least a portion of a rear surface of one or more of the first and second microelectronic elements 912A, 914A.

In any of the embodiments described herein, the microelectronic assembly may include additional heat spreaders disposed in other locations of the microelectronic assemblies.

Figure 4:
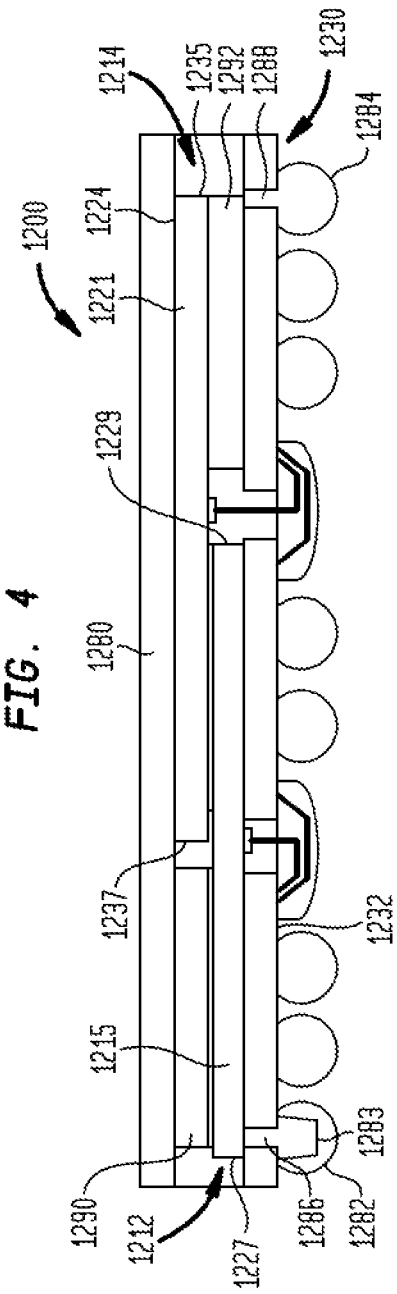
FIG. 4 is a diagrammatic sectional view of a stacked microelectronic assembly according to another embodiment of the present invention.

FIG. 4 shows a microelectronic assembly 1200, as described above, including a heat spreader 1280 attached at least to the rear surface 1224 of the second microelectronic element 1214. The heat spreader 1280 may be in thermally conductive communication with the entire rear surface 1224 of the second microelectronic assembly 1214 and may extend beyond the first and second edges 1235, 1237 of the second microelectronic element. A support element 1290 may be made of silicon or any other suitable material and may be disposed between the heat spreader 1280 and the first end region 1215 of the first microelectronic element 1212. The support element can be made of thermally conductive material, such as metal, a metal-filled polymer material, e.g., conductive epoxy, graphite, adhesive, solder or any material suitable to improve heat transfer and dissipation within the assembly and between the assembly and the environment.

Another support element 1292 may be disposed between the first end region 1221 of the second microelectronic element 1214 and the dielectric element 1230. Support element 1292 may be partly or entirely made of silicon. The heat spreader 1280 may extend beyond the first and second edges 1227, 1229 of the first microelectronic element. As discussed above, the heat spreader 1280 may be entirely or partly made of metal, graphite, or any other suitable thermally conductive material and may be attached to or in thermal communication with other parts of the assembly through a thermally conductive adhesive which can be compliant or a thermally conductive grease. In one embodiment, particularly when the microelectronic elements consist essentially of one type of semiconductor materials, e.g., silicon, the support elements 1290, 1292 can consist essentially of the same semiconductor material.

In addition to the heat spreader 1280, the microelectronic assembly 1200 may include one or more thermally conductive balls 1282, 1284. The balls 1282, 1284 typically are made of solder, but may include a core of thermally conductive metal such as copper balls therein or copper posts, as illustrated at 1283. Thermally conductive balls 1282 may be attached to the front surface 1232 of the dielectric element 1230 in substantial alignment with the first edge 1227 of the first microelectronic element 1212. A thermally conductive connector 1286 may be attached to one or more thermally conductive balls 1282 and may extend through the dielectric element 1230. The thermally conductive balls 1284 may be attached to the front surface 1232 of the dielectric element 1230 in substantial alignment with the first edge 1235 of the second microelectronic element 1214. A thermally conductive connector 1288 may be attached to one or more thermally conductive balls 1284 and may extend through the dielectric element 1230.

Figure 5:
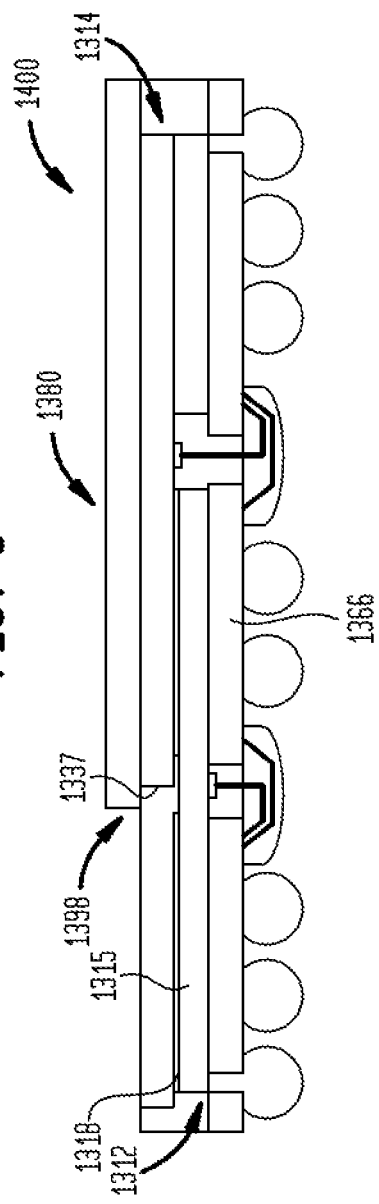
FIG. 5 is a diagrammatic sectional view of a stacked microelectronic assembly according to yet another embodiment of the present invention.

FIG. 5 shows a variation of the embodiment depicted in FIG. 4. In this variation, the microelectronic assembly 1400 does not need to include a support element between the first end region 1315 of the first microelectronic 1314 and the heat spreader 1380. The heat spreader 1380 may include a step 1398 adjacent the second edge 1337 of the second microelectronic element 1314. The step 1398 enables the heat spreader 1380 to contact, or at least be in close proximity to, the rear surface 1318 of the first microelectronic element 1312.

Figure 6:
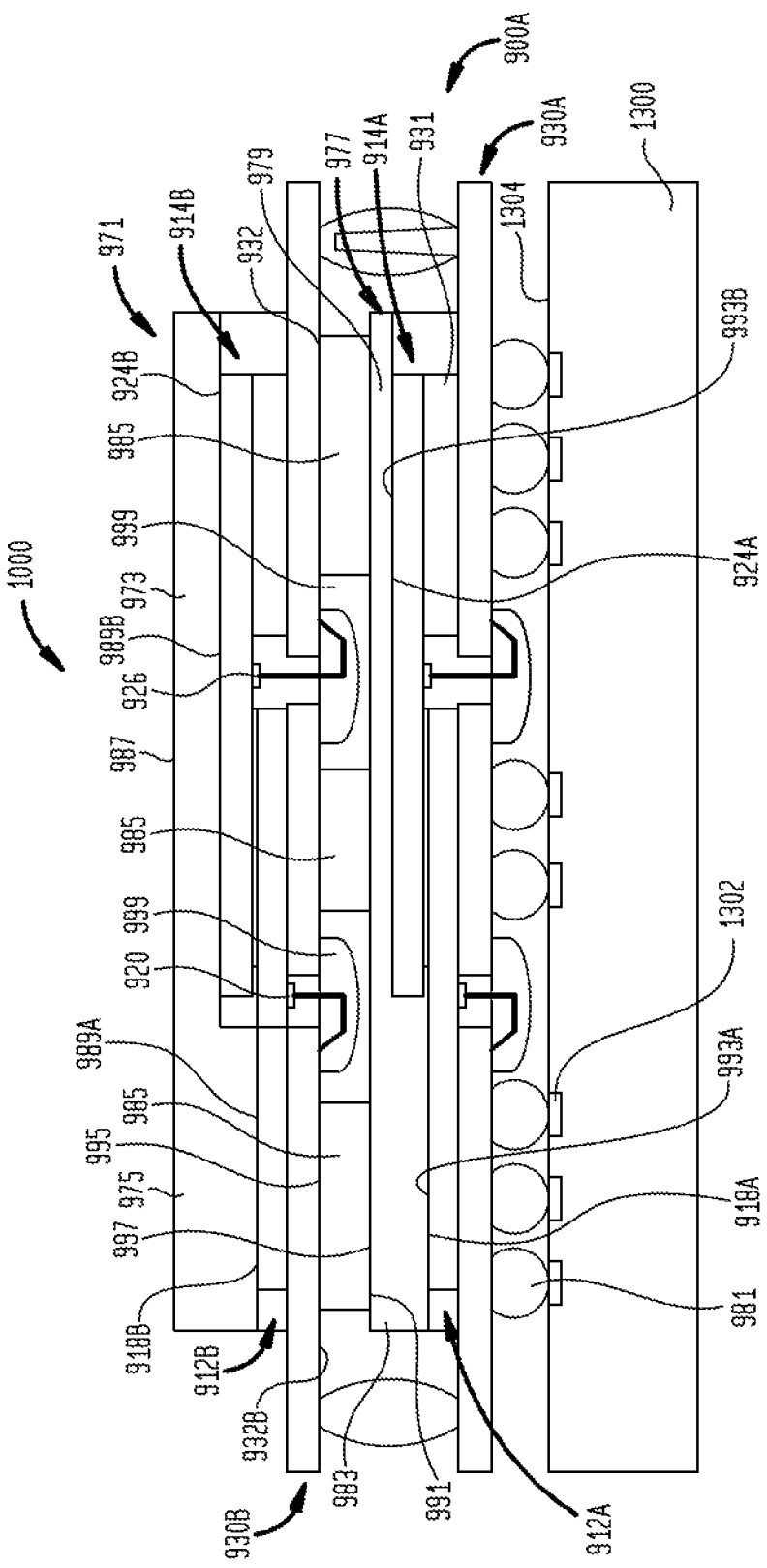
FIG. 6 is a diagrammatic sectional view of a stacked microelectronic assembly according to an embodiment of the present invention.

FIG. 6 shows a variation of the embodiment illustrated in FIG. 3. In the variation depicted in FIG. 6, the heat spreader 971 is in thermal communication with the first microelectronic element 912B and the second microelectronic element 914B of microelectronic assembly 900B. The heat spreader 971 may have a first substantially planar surface 987 facing away from rear surfaces 918B and 924B of the first and second microelectronic elements 912B, 914B, respectively. In addition, the heat spreader 971 may have second and third substantially planar surfaces 989A and 989B facing toward the rear surfaces 918B and 924B of the first and second microelectronic elements 912B, 914B, respectively. The heat spreader 971 may include a first portion 973 in thermal communication with and overlying the rear surface 924B of the second microelectronic element 914B and a second portion 975 in thermal communication with and overlying the rear surface 918B of the first microelectronic element 912B. In one specific embodiment, the first portion 973 of heat spreader 971 may be in thermal contact with part or the entire rear surface 924B of the second microelectronic element 914B such as through a solder, thermally conductive grease or thermally conductive adhesive, for example. Similarly, the second portion 975 of heat spreader 971 may be in thermal contact with part or the entire rear surface 918B of the first microelectronic element 912B. The second portion 975 of the heat spreader 971 may be thicker than the first portion 973.

With continued reference to FIG. 6, another heat spreader 977 may be in thermal communication with the first microelectronic element 912A and the second microelectronic element 914A of microelectronic assembly 900A. The heat spreader 977 may include a first substantially planar surface 991 facing a way from the first and second microelectronic elements 912A and 914A. Moreover, the heat spreader 977 may include second substantially planar surfaces 993A and 993B facing toward the rear surfaces 918A and 924A of the first and second microelectronic elements 912A, 914A, respectively. In addition, the heat spreader 977 may include a first portion 979 in thermal communication with and overlaying the rear surface 924A of the second microelectronic element 914A and a second portion 983 in thermal communication with and overlaying the rear surface 918A of the first microelectronic element 912A. In one specific embodiment, the first portion 979 of the heat spreader 977 may be in thermal contact with part or the entire rear surface 924A of the second microelectronic element 914A, similar to the arrangement of heat spreader 971. Similarly, the second portion 983 of the heat spreader 977 may be in thermal contact with part or the entire rear surface 918A of the first microelectronic element 912A. The second portion 983 of the heat spreader 977 may be thicker than its first portion 979.

A thermally conductive material 985 may be disposed between the heat spreader 977 and the dielectric element 930B. The thermally conductive material 985 may include one or more layers of any suitable material and may be between 25 to 100 microns thick. Suitable thermally conductive materials include, but are not limited to, a thermally conductive grease, solder, indium or any suitable thermally conductive adhesive. The thermally conductive material 985 may be applied to surfaces of one or both of the dielectric element 930B and the heat spreader 977 in liquid or not fully solidified state. In that way the material can flow into spaces therebetween. Accordingly, the thermally conductive material can conform to variation in height of the surfaces it contacts. In some embodiments, the thermally conductive material 985 may be a monolithic or integral structure including one or more apertures 999 substantially aligned with the contacts 920 and 926 of the first and second microelectronic elements 912B and 914B. Alternatively, the thermally conductive material 985 may include multiple spaced apart and discrete portions. In a particular embodiment, the thermally conductive material 985 can be electrically conductive. In such embodiment, such electrically conductive material could be used as a conductive plane and could be electrically connected to ground. The microelectronic assembly 900A may include a support element 931 between the second microelectronic element 914A and the dielectric element 930A.

As seen in FIG. 6, any of the microelectronic assemblies described herein may be electronically coupled to a circuit panel or board. For example, microelectronic assembly 900A may include a plurality of joining units or stack interconnects, such as solder balls 581 or copper pillars. Solder balls 981 electrically connect microelectronic assembly 900A to circuit panel 1300. While FIG. 6 only shows solder balls 981 connecting microelectronic assembly 900A to circuit panel 1300, it is contemplated that any electrically conductive element may interconnect circuit panel 1300 and microelectronic assembly 900A. One or more electrically conductive elements or terminals 1302 are exposed at the first surface 1304 of the circuit panel 1300. The first surface 1304 of the circuit panel 1300 faces the solder balls 981. Solder balls 981 are attached to terminals 1302 and are therefore electrically interconnected to at least some of the circuits in circuit panel 1300.

Figure 7:
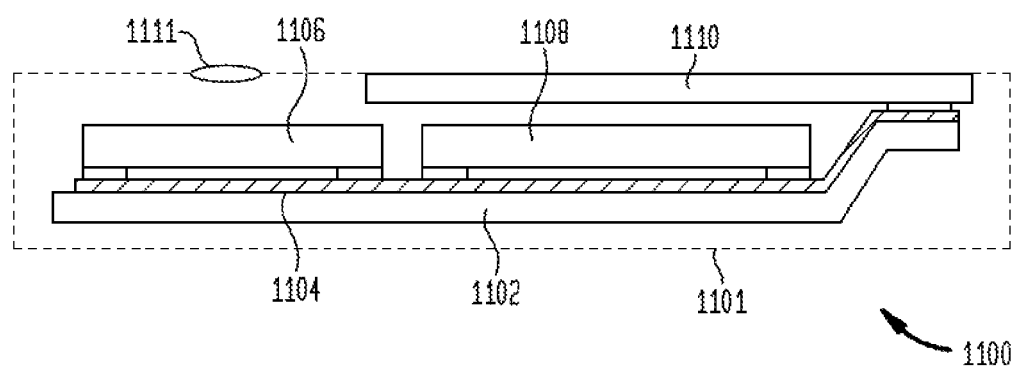
FIG. 7 is a schematic depiction of a system according to one embodiment of the invention.

The microelectronic assemblies described above can be utilized in construction of diverse electronic systems, as shown in FIG. 7. For example, a system 1100 in accordance with a further embodiment of the invention includes a microelectronic assembly 1106 as described above in conjunction with other electronic components 1108 and 1110. In the example depicted, component 1108 is a semiconductor chip whereas component 1110 is a display screen, but any other components can be used. Of course, although only two additional components are depicted in FIG. 7 for clarity of illustration, the system may include any number of such components. The microelectronic assembly 1106 may be any of the assemblies described above. In a further variant, any number of such microelectronic assemblies may be used. Microelectronic assembly 1106 and components 1108 and 1110 are mounted in a common housing 901, schematically depicted in broken lines, and are electrically interconnected with one another as necessary to form the desired circuit. In the exemplary system shown, the system includes a circuit panel 1102 such as a flexible printed circuit board, and the circuit panel includes numerous conductors 1104, of which only one is depicted in FIG. 7, interconnecting the components with one another. However, this is merely exemplary; any suitable structure for making electrical connections can be used. The housing 1101 is depicted as a portable housing of the type usable, for example, in a cellular telephone or personal digital assistant, and screen 1110 is exposed at the surface of the housing. Where structure 1106 includes a light-sensitive element such as an imaging chip, a lens 1111 or other optical device also may be provided for routing light to the structure. Again, the simplified system shown in FIG. 7 is merely exemplary; other systems, including systems commonly regarded as fixed structures, such as desktop computers, routers and the like can be made using the structures discussed above.

It will be appreciated that the various dependent claims and the features set forth therein can be combined in different ways than presented in the initial claims. It will also be appreciated that the features described in connection with individual embodiments may be shared with others of the described embodiments.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly comprising:
    a dielectric element having oppositely-facing first and second surfaces and first and second apertures extending between the surfaces, the dielectric element further having conductive elements thereon;
    a first microelectronic element having a rear surface, a front surface facing the first surface of the dielectric element, and opposed edge surfaces extending between the front and rear surfaces; the first microelectronic element having a plurality of contacts exposed at the front surface thereof;
    a second microelectronic element having a front surface facing the first surface of the dielectric element, an opposed rear surface, and opposed edge surfaces extending between the front and rear surfaces, the second microelectronic element overlying the first microelectronic element such that only one of the opposed edge surfaces of the first microelectronic element extend beyond one of the opposed edge surfaces of the sound microelectronic element, the second microelectronic element having a plurality of contacts at the front surface;
    first leads extending from contacts of the first microelectronic elements through the first aperture to at least some of the conductive elements and second leads extending from contacts of the second microelectronic element through the second aperture to other of the conductive elements; and
    a heat spreader thermally coupled to at least one of the first microelectronic element or the second microelectronic element.

2. The microelectronic assembly as claimed in claim 1, wherein the second microelectronic element further comprises contacts extending along a central region of the front surface of the second microelectronic element.

3. The microelectronic assembly as claimed in claim 2, wherein the first microelectronic element further comprises contacts extending along a central region of the front surface of the first microelectronic element.

4. The microelectronic assembly as claimed in claim 1, wherein the first and second leads are wire bonds.

5. The microelectronic assembly as claimed in claim 1, wherein the heat spreader is partly or entirely made of graphite.

6. The microelectronic assembly as claimed in claim 1, wherein the heat spreader includes a metallic sheet.

7. The microelectronic assembly as claimed in claim 1, wherein the heat spreader covers at least the rear surface of the first microelectronic element.

8. The microelectronic assembly as claimed in claim 1, wherein the heat spreader covers at least the rear surface of the second microelectronic element.

9. The microelectronic assembly as claimed in claim 1, further comprising thermally conductive balls thermally coupled to the dielectric element and a thermally conductive connector extending through the dielectric element and coupling one of the thermally conductive balls to the dielectric element.

10. The microelectronic assembly as claimed in claim 1, wherein the entire heat spreader extends along a plane.

11. The microelectronic assembly as claimed in claim 10, further comprising a support element between the heat spreader and the first microelectronic element.

12. The microelectronic assembly as claimed in claim 1, wherein the heat spreader includes openings through which the first or second leads of the first or second microelectronic elements extend therethrough.

13. The microelectronic assembly as claimed in claim 1, wherein the first and second microelectronic elements are respectively first and second semiconductor chips.

* * * * *